United States Patent
Huang

(10) Patent No.: US 11,248,822 B2
(45) Date of Patent: Feb. 15, 2022

(54) ENERGY RECOVERY SYSTEM FOR A SEMICONDUCTOR FABRICATION FACILITY

(71) Applicant: GLOBALFOUNDRIES U.S. Inc., Santa Clara, CA (US)

(72) Inventor: Thomas Huang, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 265 days.

(21) Appl. No.: 16/522,270

(22) Filed: Jul. 25, 2019

(65) Prior Publication Data

US 2021/0025620 A1   Jan. 28, 2021

(51) Int. Cl.
*H01L 21/67* (2006.01)
*F24H 1/00* (2006.01)

(52) U.S. Cl.
CPC ...................... *F24H 1/00* (2013.01)

(58) Field of Classification Search
CPC ....... F25B 27/00; F24H 1/00; H01L 21/67265
See application file for complete search history.

(56) References Cited

U.S. PATENT DOCUMENTS

| | | | |
|---|---|---|---|
| 6,349,546 B1 * | 2/2002 | Yoo | C30B 25/10 62/50.2 |
| 6,369,371 B2 | 4/2002 | Havens et al. | |
| 6,370,897 B1 * | 4/2002 | Suenaga | H01L 21/67098 62/238.1 |
| 6,789,618 B2 | 9/2004 | Pearson | |
| 6,799,539 B2 * | 10/2004 | Suenaga | F28D 7/16 122/7 R |
| 7,178,337 B2 * | 2/2007 | Pflanz | F03G 6/045 60/641.2 |
| 8,275,483 B2 | 9/2012 | Higgins | |
| 8,436,489 B2 * | 5/2013 | Stahlkopf | F04B 49/22 307/43 |
| 8,741,155 B2 * | 6/2014 | Coulter | C02F 1/70 210/748.1 |
| 2010/0307171 A1 | 12/2010 | Hamann et al. | |
| 2012/0037233 A1 | 2/2012 | Seeliger | |

FOREIGN PATENT DOCUMENTS

CN   201251371 Y   6/2009

* cited by examiner

*Primary Examiner* — Gregory A Wilson
(74) *Attorney, Agent, or Firm* — Hoffman Warnick LLC

(57) ABSTRACT

One illustrative energy recovery system disclosed herein includes a semiconductor fabrication facility ("fab") and a closed chilled water loop including a chilled water stream delivered to the fab and a returning water stream that is received from the fab. In this example, the system also includes a primary heat exchanger having a first fluid side and a second fluid side, the first fluid side is adapted to receive supply water and the second fluid side is adapted to receive at least a portion of the returning return water stream, wherein the primary heat exchanger is adapted to effectuate heat transfer between the supply water flowing in the first fluid side and the returning water stream flowing in the second fluid side.

18 Claims, 1 Drawing Sheet

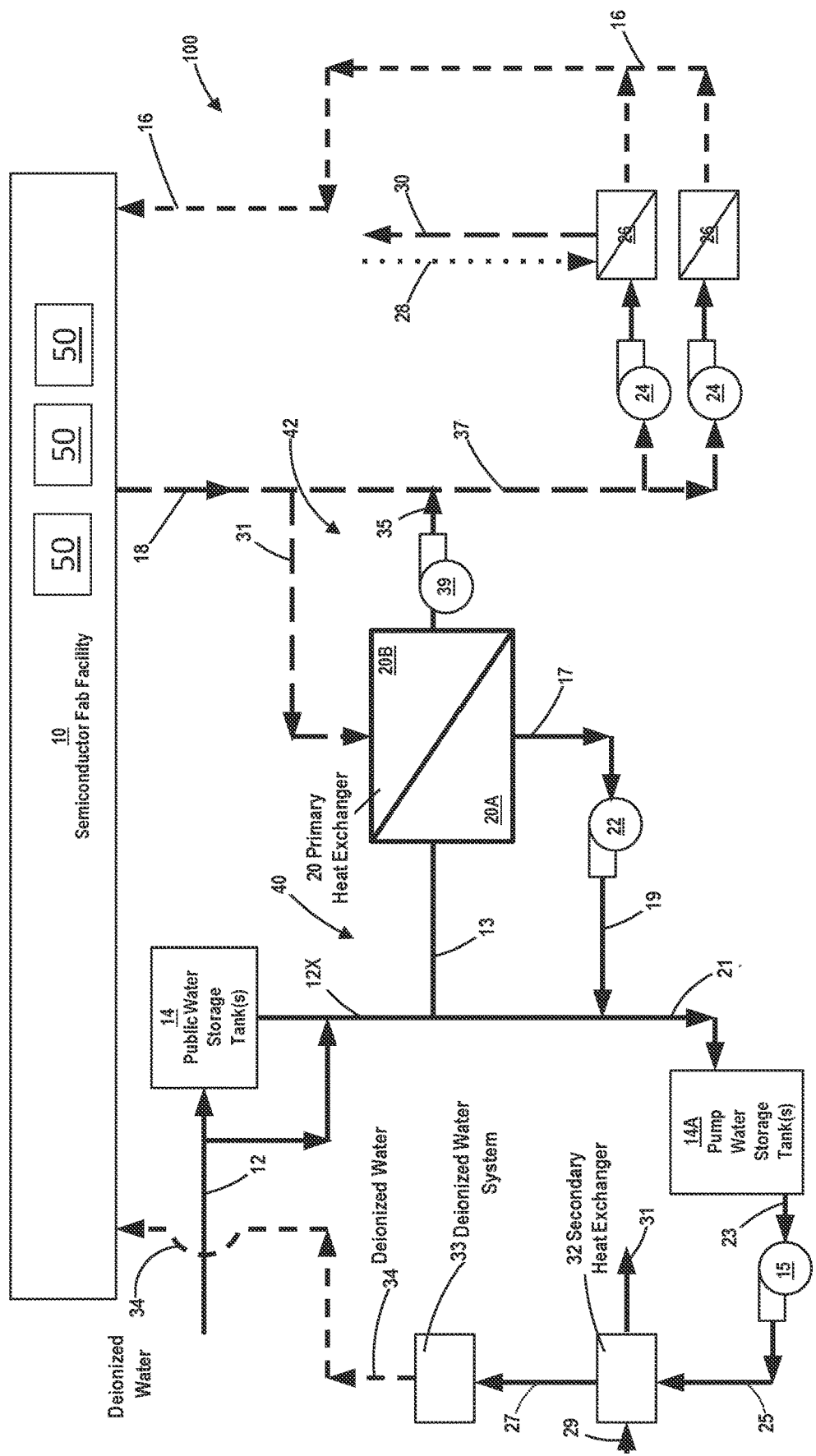

ENERGY RECOVERY SYSTEM FOR A SEMICONDUCTOR FABRICATION FACILITY

BACKGROUND

Field of the Disclosure

Generally, the present disclosure relates to various illustrative embodiments of a novel energy recovery system for a semiconductor fabrication facility.

Description of the Related Art

Integrated circuit (IC) products, e.g., computer chips, are fabricated in a semiconductor fabrication facility ("fab"). Modern semiconductor fabrication facilities typically occupy a relatively large land area and contain many climate-controlled buildings that house many processing tools that are operated by thousands of employees to manufacture IC products. A fab typically includes various mechanical systems to provide necessary utilities, e.g., heating, ventilation, water, air conditioning, piping, etc., to the fab to operate the processing tools and maintain the internal environment within the fab. In general, the operation of a modern semiconductor fabrication facility results in the consumption of an enormous amount of resources, e.g., electrical power, water, etc., all at great cost to the semiconductor fabrication facility. Manufacturers of IC products are under constant pressure to reduce operating costs so that their products remain competitively priced in the highly competitive market for IC products.

The present disclosure is directed to various illustrative embodiments of a novel energy recovery system for a semiconductor fabrication facility.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various illustrative embodiments of a novel energy recovery system for a semiconductor fabrication facility. One illustrative system disclosed herein includes a semiconductor fabrication facility ("fab") and a closed chilled water loop comprising a chilled water stream delivered to the fab and a returning water stream that is received from the fab. In this example, the system also includes a primary heat exchanger having a first fluid side and a second fluid side, the first fluid side is adapted to receive supply water, the second fluid side is adapted to receive at least a portion of the returning water stream, wherein the primary heat exchanger is adapted to effectuate heat transfer between the supply water flowing in the first fluid side and the returning water stream flowing in the second fluid side.

Yet another illustrative novel system disclosed herein includes a semiconductor fabrication facility ("fab"), a plurality of water-cooled processing tools positioned within the fab and a closed process cooling water loop that is dedicated to supplying chilled water to the plurality of water-cooled processing tools, wherein the process cooling water loop includes a chilled water stream delivered to the fab that flows to the plurality of water-cooled processing tools and a returning water stream is received from the plurality of water-cooled processing tools. In this example, the system also includes a primary heat exchanger having a first fluid side and a second fluid side, wherein the first fluid side is adapted to receive supply water supplied from a municipality and the second fluid side is adapted to receive at least a portion of the returning water stream, wherein the primary heat exchanger is adapted to increase a temperature of the supply water flowing in the first fluid side and decrease a temperature of the returning water stream flowing in the second fluid side

BRIEF DESCRIPTION OF THE DRAWINGS

The disclosure may be understood by reference to the following description taken in conjunction with the accompanying drawings, in which like reference numerals identify like elements, and in which:

FIG. 1 depicts one illustrative embodiment of a novel energy recovery system disclosed herein for a semiconductor fabrication facility.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached FIGURES. Various structures, systems and devices are schematically depicted in the drawings for purposes of explanation only and so as to not obscure the present disclosure with details which are well known to those skilled in the art. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As will be readily apparent to those skilled in the art upon a complete reading of the present application, the methods and systems disclosed herein may be employed in manufacturing a variety of different IC products and devices, including, but not limited to, logic devices, memory devices, etc. Of course, the inventions disclosed herein should not be considered to be limited to the illustrative examples depicted and described herein. With reference to the attached FIGURES, various illustrative embodiments of the methods and systems disclosed herein will now be described in more detail.

FIG. 1 depicts one illustrative embodiment of a novel energy recovery system 100 disclosed herein for a semiconductor fabrication facility 10 ("fab") as well as portions of a facility support system that provides, or supports the provision of, various utilities to the fab 10. The semiconductor fabrication facility 10 depicted in FIG. 1 is intended to be representative in nature of one or more buildings that are part of the fab 10. The fab 10 maybe adapted to form any of a variety of different types or forms of IC products or it may be dedicated to the formation of only a single type of IC product, e.g., DRAM memory devices.

As noted above, the fab 10 may include many processing tools (not shown) 50 that are adapted to perform many different processing operations commonly employed in the fabrication of IC products, e.g., deposition tools for performing various deposition processes (e.g., chemical vapor deposition (CVD), atomic layer deposition (ALD), etc.), furnaces for performing thermal growth processes and/or general heating operations, ion implantation tools, photolithography tools, inspection tools, packaging tools, etc. Many of these processing tools 50 must be cooled by chilled cooling water that is delivered to the fab and ultimately supplied directly to the tools so as to insure that the temperature of the tools remains within a desired range. The fab 10 also typically includes large and complex computer systems to operate the various tools and systems within the fab. Typically, hundreds or thousands of individuals may be working within the fab 10 on a daily basis.

The processing tools 50, systems and people within a typical fab 10 generate an enormous amount of heat, i.e., a heat load, that must be removed from the fab 10 so as to maintain the processing tools 50 at the desired temperature and maintain the internal environment of the clean room(s) within the fab 10 at the desired temperature and humidity levels. Thus, the cooling system(s) that is employed to maintain the internal environment within the fab 10 as well as the operational temperature of the processing tools 50 is important to the successful operation of the fab 10.

A modern semiconductor fabrication facility uses cooled or chilled water produced by a chilled water plant for a variety of purposes. For example, the chilled water plant (not shown) may supply many different streams of chilled water to the fab 10 via various closed chilled water loops. These different closed loops of cooling water may be at different temperatures and the flow rate of the chilled or cooled water in each of the closed loops may also be different. In one illustrative embodiment, the chilled water plant may supply two primary loops of chilled water to the fab 10: a medium temperature loop (MT loop) and a relatively cooler low temperature loop (LT loop). In one illustrative example, the MT loop may deliver a chilled water stream to the fab 10 at a temperature of about 51° F. which returns from the fab 10 at a temperature of about 61° F. On the other hand, the cooler LT loop may deliver a chilled water stream to the fab 10 at a temperature of about 41° F. which returns from the fab 10 at a temperature of about 51° F.

As will be appreciated by those skilled in the art after a complete reading of the present application, heat will be recovered from the returning water stream of one of the closed water loops that services the fab 10 so as to heat water received by the fab 10 (and perhaps stored at the fab 10) from a municipality. The returning water stream of any closed loop of cooling water that supports the fab 10 may be used for this purpose, as long it is of sufficient temperature to perform the heat transfer operations disclosed below. Typically, the closed water loop with the highest temperature returning water stream will be used as it typically will be the most efficient in terms of heat transfer, but, in some cases, another closed water loop with a cooler returning water stream may be used to provide the desired heat transfer as more fully explained below.

Most modern fabrication facilities 10 have a dedicated chilled water loop —typically referred as the process cooling water loop that is used only to cool the processing tools 50 in the fab 10. Another dedicated chilled water loop can be used to cool the internal environment of the clean room in the fab 10 by circulating chilled water through coils located in various air handling units and return air chases (not shown) in the fab 10. This later chilled water loop may also be used for other purposes as well. In the example discussed below, heat from the returning water stream of the process cooling water loop the loop dedicated to the cooling of the processing tools 50 —will be used to heat the city water supplied to or stored at the fab 10. However, as should be clear from the foregoing, the presently disclosed inventions should not be considered to be limited to only situations where the process cooling water loop is used for the purposes disclosed herein, as any closed chilled water loop may be used depending upon the particular application. Moreover, when it is stated herein that a closed chilled water loop comprises a chilled water stream delivered to the fab or a return water stream received from the fab, such language should be understood to cover situations where the chilled water in chilled loop is used for any purpose, e.g., the chilled water loop may be a process cooling water loop that is dedicated to supplying cooling water to a plurality of water-cooled processing tools 50 within the fab 10 or to a chilled water loop that supplies chilled water to the fab 10 for purposes of cooling the ambient air within the clean room(s) within the fab via use of various air handling units.

As discussed above and with reference to FIG. 1, in one illustrative embodiment of a fab 10 disclosed herein, the support system for the fab 10 includes a closed loop cooling system whereby a relatively cooler (and representative) chilled process cooling water stream is delivered to the fab 10 via line 16 and a relatively warmer (and representative) process cooling return water stream exits the fab 10 via line 18. Although only a single process cooling water line 16 is depicted in the drawing, in actual practice, the single process cooling water line 16 may be split into multiple streams of process cooling water that enter the fab 10 at various locations. Similarly, although only a single process cooling water return line 18 is depicted in the drawing, in actual practice, the single process cooling water return streams may be split into multiple streams of return process cooling water that exit the fab 10 at various locations. As noted above, in this illustrative example, the closed process cooling water loop is dedicated to cooling the processing tools 50 within the fab 10.

As will be appreciated by those skilled in the art after a complete reading of the present application, the heat load of the water-cooled processing tools 50 within the fab 10 will be transferred to the chilled process cooling water stream as the chilled process cooling water stream is circulated through the various processing tools 50 within the fab 10. After absorbing the heat load of the processing tools 50, the previously chilled process cooling water stream that was delivered to the fab 10 via line 16 exits the fab 10 as the relatively warmer returning process cooling water stream via line 18. The system 100 includes various valves (not shown), e.g., control valves, isolation valves, etc., control sensors (not shown), e.g., pressure, temperature and flow rate sensors, etc., and pumps (some of which are not shown) so as to route various fluids to desired locations and equipment within the system as described more fully below. The manner in which such equipment, sensors and valves are arranged, monitored and operated so as to effectuate the desired routing of various fluid streams is well known to those skilled in the art and will not be described in any detail.

Supply water is supplied to the facilities or support system of the fab 10 via a representative incoming supply water line 12. The supply water is typically supplied by a local municipality, e.g., a city, and it is typically potable water that is suitable for human consumption. However, the presently disclosed subject matter should not be considered as limited to only situations where the supply water to the system 100 is supplied by a municipality. In one illustrative embodiment, the support system also includes one or more water storage tanks 14 that are adapted to store relatively large quantities of the supply water. The storage tanks 14 are typically provided proximate the location of the fab 10 so as to insure that water can be supplied to the fab 10 even in the event of an interruption in the supply of the supply water from the municipality. Supply water may be taken from the storage tanks 14 on an as needed basis. In this embodiment, the support system also includes one or more pump water storage tanks 14A that will be used for purposes described more fully below.

As will be appreciated by those skilled in the art, manufacturing of IC products typically requires the consumption of significant amounts of highly purified water, e.g., deionized (or ultra-pure) water. For purposes of the following discussion, and as used in the claims, such purified water will be referred to deionized water. In the illustrative example of the support system depicted herein, deionized water is supplied to the fab 10 via line 34. The supply water is processed in a simplistically and schematically depicted deionized water system 33 so as to produce the deionized water. In the depicted example, the deionized water system 33 is physically located outside of the fab 10, but that may not be the case in all situations. Such deionized water systems 33 are commercially available and the components and operation of such deionization (purification) systems are well known to those skilled in the art. For example, such deionization systems may include various components or subsystems that perform various functions, e.g., filtration, reverse osmosis, degasification, electro-deionization, etc. The deionized water that is delivered to the fab 10 typically must meet very strict guidelines in terms of its characteristics and qualities, e.g., there are typically limits on the allowable amounts of entrained particulate matter, total organic carbon (TOC), dissolved oxygen/nitrogen, etc., in the deionized water, as well as the electrical conductivity of the deionized water.

In general, the production of deionized water requires the temperature of the supply water that is going to be deionized to be very tightly controlled. For example, in one illustrative embodiment, the supply water that enters the deionized water system 33 via line 27 needs to be at a relatively precise temperature, e.g., 70° F.±1°. Also depicted in FIG. 1 are a representative secondary heat exchanger 32 and a simplistically depicted pump 15 that is positioned between the pump water storage tank(s) 14A and the secondary heat exchanger 32. In practice, the support system may include one secondary heat exchanger for heating the supply water (when the supply water is below 70° F.) and another secondary heat exchanger for cooling the supply water (when the supply water is above 70° F.). Thus, the purpose of the secondary heat exchanger(s) 32 is to insure that the supply water that exits the secondary heat exchanger 32 at line 27 is at the desired temperature, e.g., 70° F.±1°, before it enters the deionized water system 33. These final temperature adjustments are sometimes called trim temperature control and the energy sources are paid heating/cooling rather than free or recovered energy.

A crossing heat transfer fluid enters the secondary heat exchanger 32 via line 29 and exits the secondary heat exchanger 32 via line 31. In the case where the secondary heat exchanger 32 is used to heat the supply water entering via line 25, the temperature of the heat transfer fluid in line 29 will be greater than the temperature of the heat transfer fluid in line 31 after it exits the secondary heat exchanger 32. The opposite situation would be present in the case where the secondary heat exchanger 32 is used to cool the supply water that enters the secondary heat exchanger 32 via line 25, i.e., the temperature of the heat transfer fluid in line 29 will be less than the temperature of the heat transfer fluid in line 31 after it exits the secondary heat exchanger 32. The secondary heat exchanger 32 may take a variety of forms, e.g., a shell and tube heat exchanger, a plate and frame heat exchanger, etc. In many applications, the secondary heat exchanger(s) 32 may actually be an integral part or a subsystem of the deionized water system 33.

Also depicted in FIG. 1 is a primary heat exchanger 20 and simplistically depicted pumps 22 and 39. The primary heat exchanger 20 may take a variety of forms, e.g., a shell and tube heat exchanger, a plate and frame heat exchanger, etc. The primary heat exchanger 20 has a first fluid side 20A and a second fluid side 20B. In general, in one illustrative embodiment, substantially all of the incoming supply water flow in line 12X will be modulated via one or more variable speed drive (VFD) pumps to the side-stream loop 40 where it will be circulated through the first fluid side 20A of the primary heat exchanger 20 while the returning process cooling water stream in line 18 will be directed to a side-stream loop 42 where it will be modulated via one or more variable speed drive (VFD) pumps through the second fluid side 20B of the primary heat exchanger 20, so as to effectuate heat transfer between the supply water stream in the first fluid side 20A and the returning process cooling water stream in the second fluid side 20B. In one illustrative embodiment, as described more fully below, when the temperature of the supply water stream (in line 12X) to be introduced into the first fluid side 20A is less than the temperature of the returning process cooling water stream (in line 18) to be introduced into the second fluid side 20B, the energy recovery system 100 harvests the available free energy, i.e., the available heat in the returning process cooling water stream (in line 18), to heat the supply water (from line 12X) by modulating the flow of the supply water stream and the returning process cooling water stream. As a result of this temperature differential, the returning process cooling water stream in the second fluid side 20B effectively increases the temperature (i.e., warms) the supply water flowing through the first fluid side 20A of the primary heat exchanger 20.

In the following discussion, it is assumed that the supply water in line 12X is at a temperature that is less than the temperature of the returning process cooling water stream in line 18. With respect to the side-stream loop 40 of the incoming supply water, in one illustrative embodiment, substantially all of the relatively cooler supply water in line 12X (from the storage tank(s) or directly from the water line 12) enters the primary heat exchanger 20 via line 13 where its temperature is increased, and it exits the primary heat exchanger 20 via line 17 as a heated supply water stream driven by the VFD pump 22. The heated supply water stream then exits the pump 22 via line 19 where it flows (via line 21) to the pump water storage tank 14A.

With respect to the side-stream loop 42 of the relatively warmer returning process cooling water stream in line 18, at least a portion of the relatively warmer returning process cooling water stream in line 18 enters the second fluid side 20B of the primary heat exchanger 20 via line 31 and exits the primary heat exchanger 20 via line 35 as a cooled returning process cooling water stream driven by the VFD pump 39. This cooled returning process cooling water stream exits the pump 39 and then re-combines with the relatively warmer returning process cooling water stream in line 18 and flows (via line 37) to a plurality of simplistically depicted VFD pumps 24 that are arranged in an illustrative parallel configuration. In turn, the output of the pumps 24 is supplied to one or more heat exchangers 26, e.g., shell and tube heat exchangers or plate/frame heat exchangers. The chilled water plant (not shown) supplies chilled water via another closed chilled water loop to cool the returning process cooling water that exits the pumps via heat transfer in the heat exchangers 26. In one illustrative example, chilled water at a temperature of about 51° F. may be supplied to the heat exchangers 26 via line 28 and return to the chilled water plant via line 30 after it has cooled the returning process cooling water flowing through the heat exchangers 26. As a result, the returning process cooling water that enters the heat exchangers 26 (via pumps 24) is cooled and exits the heat exchangers 26 as the chilled process cooling water stream that is thereafter again delivered to the fab 10 via line 16.

As will be appreciated by those skilled in the art after a complete reading of the present application, in this illustrative example, the inclusion of the primary heat exchanger 20 in the energy recovery system 100 permits at least a portion of the relatively warmer returning process cooling water stream in line 18 to be used to heat a portion of the relatively cooler supply water that is initially supplied to or stored at the support system. Using this approach, the primary heat exchanger 20 may be used to increase the temperature of the supply water that ultimately enters the secondary heat exchanger 32 via line 25, thereby reducing the amount of heating that needs to be supplied by the secondary heat exchanger 32 to insure that the supply water in line 27 (that exits the secondary heat exchanger 32) is at the desired temperature, e.g., 70° F.±1°, for introduction into the deionized water system 33. From an overall perspective, since the temperature of the relatively warmer returning process cooling water stream in line 18 will ultimately be cooled in the heat exchangers 26 to the desired temperature of the chilled process cooling water stream delivered to the fab 10 via line 16, the portion of the relatively warmer returning process cooling water stream in line 18 that is diverted to and cooled in the primary heat exchanger 20 (to warm the incoming supply water on the first fluid side 20A) is effectively free energy that can be put to a useful purpose. Moreover, the cooling of the portion of the relatively warmer returning process cooling water stream in line 18 that flows through the second fluid side 20B of the primary heat exchanger 20 effectively reduces the heat load that must be removed by the heat exchangers 26 and ultimately the chilled water plant, thereby reducing operating costs.

Of course, the efficiency and heat transfer capabilities of the energy recovery system 100 may depend upon a variety of factors, e.g., the environmental temperature conditions at the location of the fab 10, the heat load from the processing tools 50 within the fab 10, the temperature of the supply water that is supplied to the support system (via line 12 or via the tank(s) 14), the temperature and flow rate of the chilled process cooling water stream, the temperature and flow rate of the returning process cooling water stream and/or the desired temperature and flow rate of the water that enters the deionized water system 33 via the line 27.

By way of example only, in one illustrative embodiment, the fab 10 may be in a locale such that the average temperature of the supply water (from line 12 or the tank(s) 14) may be about 36° F. during the winter and about 75° F. in the summer. Moreover, based upon the heat load of the processing tools 50 within the fab 10, the chilled process cooling water stream delivered to the fab 10 via line 16 may need to be at a temperature of about 59° F., while the relatively warmer returning process cooling water stream in line 18 may be at a temperature of about 68° F. In this example, the temperature of the supply water in line 27 after it exits the secondary heat exchanger 32 will have a target value of 70° F.±1°.

Based upon the above illustrative conditions, the flow of the various streams of water in the energy recovery system 100 during winter conditions will now be described. As noted above, various sensors and valves will be deployed throughout the support system to provide feedback as to the temperature, pressure and flow rate of various water streams throughout the energy recovery system 100 so as to permit operators to achieve the desired energy transfer effects described below. In one illustrative example, with respect to the side-stream loop 40, all of the relatively cooler supply water in line 12X, at a temperature of about 36° F. during winter conditions, enters the first fluid side 20A of the primary heat exchanger 20 via line 13 and exits the primary heat exchanger 20 via line 17 at a temperature of about 65° F. as driven by the pump 22 and ultimately flows to the pump water storage tank 14A. This heated 65° F. supply water is then pumped (via pump 15) to the secondary heat exchanger 32 where it will be trim heated (via heat transfer with the heat transfer fluid flowing through the secondary heat exchanger 32 in lines 29 and 31) to the desired temperature of 70° F.±1°. At that point, this heated water then flows out of the secondary heat exchanger 32 via line 27 and is introduced into the deionized water system 33 such that deionized water may be delivered to the fab 10 via line 34.

Continuing with this illustrative example discussed above, with respect to the side-stream loop 42 of the relatively warmer returning process cooling water stream in line 18, at least a portion of the relatively warmer returning process cooling water stream in line 18 enters the second fluid side 20B of the primary heat exchanger 20 via line 31 at a temperature of about 68° F. and exits the second fluid side 20B of the primary heat exchanger 20 via line 35 as a relatively cooler returning process cooling water stream at a temperature of about 65° F. and flows to the inlet of pump 39. This fluid then exits the pump 39 where it then re-combines with the returning process cooling water stream in line 18 and flows via line 37 to the pumps 24. In turn, the returning process cooling water stream that exits the pumps 24 is supplied to one or more heat exchangers 26. Chilled water from the chilled water plant enters the heat exchangers 26 via line 28 at a temperature of about 51° F. and returns to the chilled water plant via line 30 at a temperature of about 58° F. As a result, the returning process cooling water stream that enters the heat exchangers 26 (via pumps 24) is cooled and exits the heat exchangers 26 as the chilled process cooling water stream at a temperature of about 59° F. which is then again delivered to the fab 10 via line 16. As will be appreciated by those skilled in the art after a complete reading of the present application, in this particular example, the primary heat exchanger 20 permits the heat energy in the returning process cooling water stream to be used to increase the temperature of the supply water flowing in the first fluid side 20A of the primary heat exchanger from about 36° F. to about 65° F. In turn, the heating of the supply water in the primary heat exchanger 20 decreases the heat load of the secondary heat exchanger 32, i.e., it decreases the amount of heating of the supply water that is required to be performed by the secondary heat exchanger 32. More specifically, by heating the supply water in the primary heat exchanger 20, the secondary heat exchanger 32 only has to increase the water temperature of the supply water by about 5° F. (from 65° F. to 70° F.). In contrast, if the relatively cold incoming supply water in line 12X (from line 12 or the tank(s) 14), at a temperature of about 36° F., was supplied directly to the secondary heat exchanger 32, then the secondary heat exchanger 32 would have to increase the temperature of the supply water by about 34° F. to insure that the supply water exiting the secondary heat exchanger 32 via line 27 would have the desired temperature of about 70° F.±1°. Thus, by using the energy (i.e., heat) present in the returning process cooling water stream (in line 18) to heat the supply water flowing through the first fluid side 20A of the primary heat exchanger 20, significant energy savings may be obtained as it relates to the operation of the fab 10. In effect, the secondary heat exchanger 32 may be used to supply the last few degrees of heating (trim) of the supply water prior to the supply water being introduced into the deionizing water system 33, i.e., the secondary heat exchanger 32 may be used to fine tune the temperature of the supply water that exits via line 27.

Additionally, since the returning process cooling water stream (in line 18) will eventually be cooled (via the heat exchangers 26) to the desired temperature of the chilled process cooling water stream (in line 16), the use of at least a portion of the heat energy within the returning process cooling water stream is effectively "free" energy that can be put to the useful purpose described above. Additionally, as noted above, by cooling a portion of the returning process cooling water stream in the second fluid side 20B of the primary heat exchanger 20 (so as to heat the supply water in the first fluid side 20A of the primary heat exchanger 20), the amount of cooling that must be performed by the heat exchangers 26 and ultimately the chilled water plant is also reduced, thereby resulting in additional cost savings.

The energy recovery system disclosed herein is environmentally friendly in that it does not involve the use of water from a natural source of water, such as a lake or river, to achieve the heat transfer described herein. When water is obtained from such natural sources of water, it typically contains foreign matter, e.g., dirt, weeds, large particulate matter, etc., that must be removed to prevent fouling of various items of equipment through which the natural water flows. Such operations are inherently expensive and can result in significant down time. Additionally, in the case where water is discharged into such a natural body of water, care must be taken to insure that water is in full compliance with many regulations directed to the discharge of water from an industrial plant, all of which cost time and money.

The above discussion was directed to the use of the primary heat exchanger 20 under anticipated conditions during the winter. During the anticipated conditions during the summer, e.g., with supply water at about 75° F., the supply water will need to be cooled to reach the desired temperature of about 70° F.±1° prior to the introduction of the supply water into the deionized water system 33. As noted above, the system may include a separate secondary heat exchanger 32 that is dedicated to cooling the supply water prior to it entering the deionized water system 33. However, under these conditions, there is only a relatively small temperature differential of about 7° F. between the incoming supply water (75° F.) that is supplied to the first fluid side 20A of the primary heat exchanger 20 and the returning process cooling water stream in line 18 (at a temperature of about 68° F.) that is supplied to the second side 20B of the primary heat exchanger 20. As a result of this relatively small temperature differential, heat transfer between the two water streams in the primary heat exchanger 20 may be limited or at best highly inefficient. In some situations, in may not be economically viable to circulate the supply water stream and the returning process cooling water stream through the primary heat exchanger 20 under these conditions. Thus, the energy recovery system 100 provides the operator with the ability to allow both the incoming supply water stream (in line 12X) and the returning process cooling water stream (in line 18) to simply bypass the primary heat exchanger 20 in appropriate situations. In such a bypass situation, the supply water (at a temperature of about 75° F.) would be cooled to the desired temperature of about 70° F.±1° in the secondary heat exchanger 32 prior to introduction to the deionized water system 33. Thus, as will be appreciated by those skilled in the art after a complete reading of the present application, the energy recovery system 100 provides operators with great flexibility in terms of regulating the flow of various streams of fluid within the energy recovery system 100 so as to achieve the desired heat transfer results based upon the particular operating conditions present at a particular fab 10 and any particular point in time throughout the year. For example, in the illustrative example depicted above, it may not be economically viable to use the primary heat exchanger 20 during the peak months of summer, i.e., the primary heat exchanger 20 may be simply bypassed during some months of the year. Of course, in other situations, the primary heat exchanger 20 may be used substantially year round. For example, if the fab 10 is located in an environment where the incoming supply water temperature in the summer months is relatively cool, e.g., 50-60° F., then the returning process cooling water stream (in line 18) may be used to heat all or a portion of the supply water (in line 12X) in the summer months as well as the winter months, i.e., on a year round basis.

As will be appreciated by those skilled in the art after a complete reading of the present application, there are various novel systems and methods disclosed herein. In one illustrative embodiment, a novel energy recovery system disclosed herein includes a semiconductor fabrication facility ("fab") 10 and a closed chilled water loop having a chilled water stream 16 delivered to the fab and a returning water stream 18 that is received from the fab. In this example, the system also includes a primary heat exchanger 20 having a first fluid side 20A and a second fluid side 20B, the first fluid side 20A is adapted to receive supply water, and the second fluid side 20 is adapted to receive at least a portion of the returning water stream 18, wherein the primary heat exchanger 20 is adapted to effectuate heat transfer between the supply water flowing in the first fluid side 20A and the returning water stream flowing in the second fluid side 20B.

Yet another novel energy recovery system disclosed herein includes a semiconductor fabrication facility ("fab") 10, a plurality of water-cooled processing tools 50 positioned within the fab and a closed process cooling water loop that is dedicated to supplying chilled water to the plurality of water-cooled processing tools 50, wherein the process cooling water loop includes a chilled water stream delivered to the fab that flows to the plurality of water-cooled processing tools 50 and a returning water stream is received from the plurality of water-cooled processing tools 50. In this example, the system also includes a primary heat exchanger 20 having a first fluid side 20A and a second fluid side 20B, wherein the first fluid side 20A is adapted to receive supply water received from a municipality and the second fluid side 20B is adapted to receive at least a portion of the returning water stream 18, wherein the primary heat exchanger 20 is adapted to increase a temperature of the supply water flowing in the first fluid side 20A and decrease a temperature of the returning water stream flowing in the second fluid side 20B.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A system comprising:
a semiconductor fabrication facility ("fab");
a closed chilled water loop comprising a chilled water stream delivered to the fab and a returning water stream that is received from the fab;
a primary heat exchanger comprising a first fluid side and a second fluid side, the first fluid side being adapted to receive supply water, the second fluid side being adapted to receive at least a portion of the returning water stream, wherein the primary heat exchanger is adapted to effectuate heat transfer between the supply water flowing in the first fluid side and the returning water stream flowing in the second fluid side; and
a secondary heat exchanger that is adapted to receive the supply water after it exits the first fluid side of the primary heat exchanger, wherein the secondary heat exchanger is adapted to increase a temperature of the supply water as it flows through the secondary heat exchanger.

2. The system of claim 1, wherein the chilled water stream delivered to the fab is at a first temperature where it enters the fab and the returning water stream is at a second temperature where it exits the fab, wherein the first temperature is less than the second temperature.

3. The system of claim 1, wherein the fab further comprises a plurality of water-cooled processing tools, wherein the closed chilled water loop is a process cooling water loop that is dedicated to supplying chilled water to the plurality of water-cooled processing tools and wherein the returning water stream is received from the plurality of water-cooled processing tools.

4. The system of claim 1, wherein the primary heat exchanger is adapted to increase a temperature of the supply water flowing in the first fluid side and decrease a temperature of the returning water stream flowing in the second fluid side.

5. The system of claim 4, wherein the supply water flowing in the first fluid side is at a first temperature where it enters the first fluid side and the returning water stream flowing in the second fluid side is at a second temperature where it enters the second fluid side, wherein the first temperature is less than the second temperature.

6. The system of claim 1, wherein the primary heat exchanger is adapted to decrease a temperature of supply water flowing in the first fluid side and the secondary heat exchanger is adapted to increase a temperature of the returning water stream flowing in the second fluid side.

7. The system of claim 6, wherein the supply water flowing in the first fluid side is at a first temperature where it enters the first fluid side and the returning water stream flowing in the second fluid side is at a second temperature where it enters the second fluid side, wherein the first temperature is greater than the second temperature.

8. The system of claim 1, further comprising:
an incoming water line in which the supply water is adapted to flow; and
at least one water storage tank that is adapted to receive supply water from the incoming water line and store supply water, wherein the supply water flowing in the first fluid side is received from at least one of the incoming water line or the at least one water storage tank.

9. The system of claim 1, further comprising:
a first pump that is adapted to receive the supply water after it exits the first fluid side of the primary heat exchanger;
a pump water storage tank that is adapted to receive the supply water from the first pump and store the supply water in the pump water storage tank; and
a second pump that is adapted to receive the supply water stored in the pump water storage tank and supply the supply water to the secondary heat exchanger.

10. The system of claim 9, further comprising a deionized water system that is adapted to receive the supply water after it exits the secondary heat exchanger.

11. A system comprising:
a semiconductor fabrication facility ("fab");
a plurality of water-cooled processing tools positioned within the fab;
a process cooling water loop that is dedicated to supplying chilled water to the plurality of water-cooled processing tools, the process cooling water loop comprising a chilled water stream delivered to the fab that flows to the plurality of water-cooled processing tools and a returning water stream that is received from the fab;
a primary heat exchanger comprising a first fluid side and a second fluid side, the first fluid side being adapted to receive supply water and the second fluid side being adapted to receive at least a portion of the returning water stream, wherein the primary heat exchanger is adapted to increase a temperature of the supply water flowing in the first fluid side and decrease a temperature of the returning water stream flowing in the second fluid side; and
a secondary heat exchanger that is adapted to receive the supply water after it exits the first fluid side of the primary heat exchanger, wherein the secondary heat exchanger is adapted to increase a temperature of the supply water as it flows through the secondary heat exchanger.

12. The system of claim 11, wherein the water stream delivered to the fab is at a first temperature and the returning water stream is at a second temperature, wherein the first temperature is less than the second temperature.

13. The system of claim 12, wherein the supply water is at a first temperature where it enters the first fluid side and the returning water is at a second temperature where it enters the second fluid side, wherein the first temperature is less than the second temperature.

14. The system of claim 11, further comprising:
an incoming water line in which supply water is adapted to flow; and
at least one water storage tank that is adapted to receive supply water from the incoming water line and store supply water, wherein the supply water flowing in the first fluid side is received from at least one of the incoming water line or the at least one water storage tank.

15. The system of claim 14, further comprising:
a first pump that is adapted to receive the supply water after it exits the first fluid side of the primary heat exchanger;
a pump water storage tank that is adapted to receive the supply water from the first pump and store the supply water; and
a second pump that is adapted to receive the supply water stored in the pump water storage take and supply the supply water to the secondary heat exchanger, wherein the secondary heat exchanger is adapted to increase a temperature of the supply water as it flows through the secondary heat exchanger.

16. The system of claim 15, further comprising a deionized water system that is adapted to receive the supply water after it exits the secondary heat exchanger.

17. A system comprising:
a semiconductor fabrication facility ("fab");
a closed chilled water loop comprising a chilled water stream delivered to the fab and a returning water stream that is received from the fab;
a primary heat exchanger comprising a first fluid side and a second fluid side, the first fluid side being adapted to receive supply water, the second fluid side being adapted to receive at least a portion of the returning water stream, wherein the primary heat exchanger is adapted to effectuate heat transfer between the supply water flowing in the first fluid side and the returning water stream flowing in the second fluid side; and
a secondary heat exchanger that is adapted to receive the supply water after it exits the first fluid side of the primary heat exchanger, wherein the secondary heat exchanger is adapted to decrease a temperature of the supply water as it flows through the secondary heat exchanger.

18. A system comprising:
a semiconductor fabrication facility ("fab");
a plurality of water-cooled processing tools positioned within the fab;
a process cooling water loop that is dedicated to supplying chilled water to the plurality of water-cooled processing tools, the process cooling water loop comprising a chilled water stream delivered to the fab that flows to the plurality of water-cooled processing tools and a returning water stream that is received from the fab;
a primary heat exchanger comprising a first fluid side and a second fluid side, the first fluid side being adapted to receive supply water and the second fluid side being adapted to receive at least a portion of the returning water stream, wherein the primary heat exchanger is adapted to increase a temperature of the supply water flowing in the first fluid side and decrease a temperature of the returning water stream flowing in the second fluid side; and
a secondary heat exchanger that is adapted to receive the supply water after it exits the first fluid side of the primary heat exchanger, wherein the secondary heat exchanger is adapted to decrease a temperature of the supply water as it flows through the secondary heat exchanger.

\* \* \* \* \*